United States Patent
Ko

(10) Patent No.: US 9,917,117 B2
(45) Date of Patent: Mar. 13, 2018

(54) DISPLAY DEVICE AND METHOD OF FABRICATING THE SAME

(71) Applicant: Samsung Display Co., Ltd., Yongin-si (KR)

(72) Inventor: Moo Soon Ko, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

(21) Appl. No.: 15/045,985

(22) Filed: Feb. 17, 2016

(65) Prior Publication Data

US 2016/0163746 A1 Jun. 9, 2016

Related U.S. Application Data

(62) Division of application No. 14/468,772, filed on Aug. 26, 2014, now Pat. No. 9,299,757.

(30) Foreign Application Priority Data

Mar. 17, 2014 (KR) .................. 10-2014-0030984

(51) Int. Cl.
*H01L 27/12* (2006.01)
*H01L 21/324* (2006.01)
*H01L 27/32* (2006.01)

(52) U.S. Cl.
CPC ........ *H01L 27/1259* (2013.01); *H01L 21/324* (2013.01); *H01L 27/1237* (2013.01);
(Continued)

(58) Field of Classification Search
CPC ............................................. H01L 27/32685
See application file for complete search history.

(56) References Cited

U.S. PATENT DOCUMENTS 6,046,489 A * 4/2000 Yamaguchi ....... H01L 27/10852
257/532
6,466,286 B1 10/2002 Seo
(Continued)

FOREIGN PATENT DOCUMENTS

JP        09-129643       5/1997
JP       2003-045873     2/2003
(Continued)

OTHER PUBLICATIONS

Non Final Office Action dated Jun. 25, 2015, in U.S. Appl. No. 14/468,772.

(Continued)

*Primary Examiner* — Shaun Campbell
*Assistant Examiner* — Aneta Cieslewicz
(74) *Attorney, Agent, or Firm* — H.C. Park & Associates, PLC

(57) ABSTRACT

A method of fabricating a display device including forming one or more thin-film transistors ("TFTs") each configured to include an active layer, a gate insulating layer, a gate electrode, a source electrode, and a drain electrode on a substrate. A storage capacitor including a first storage electrode and a second storage electrode overlapping the first storage electrode with the gate insulating layer interposed there between is also formed on the substrate. A top surface of the first storage electrode may include hillocks and the gate insulating layer is formed between the first storage electrode and the second storage electrode to conform to the shape of the top surface of the first storage electrode with the hillocks.

6 Claims, 20 Drawing Sheets

(52) U.S. Cl.
CPC ...... *H01L 27/1251* (2013.01); *H01L 27/1255* (2013.01); *H01L 27/32* (2013.01); *H01L 27/3262* (2013.01); *H01L 27/3265* (2013.01)

(56) References Cited

U.S. PATENT DOCUMENTS

| | | |
|---|---|---|
| 6,489,176 B2 | 12/2002 | Ninomiya |
| 7,446,033 B2 | 11/2008 | Lee et al. |
| 8,513,053 B2 | 8/2013 | Yamazaki et al. |
| 2001/0026444 A1* | 10/2001 | Matsushima ......... H05K 1/162 361/763 |
| 2002/0058414 A1* | 5/2002 | Derderian ............... H01L 28/60 438/686 |
| 2002/0121697 A1* | 9/2002 | Marsh ............... H01L 21/28562 257/751 |
| 2004/0219696 A1 | 11/2004 | Seo et al. |
| 2006/0176414 A1 | 8/2006 | Chen et al. |
| 2007/0161184 A1 | 7/2007 | Kim et al. |
| 2007/0291193 A1 | 12/2007 | Cheng |
| 2010/0102313 A1* | 4/2010 | Miyairi ............... H01L 27/1225 257/43 |
| 2012/0080681 A1 | 4/2012 | Kim et al. |
| 2014/0239270 A1* | 8/2014 | Ko ...................... H01L 27/1255 257/40 |

FOREIGN PATENT DOCUMENTS

| | | |
|---|---|---|
| KR | 1019920005914 | 9/1992 |
| KR | 100303796 | 7/2001 |
| KR | 1020070053472 | 5/2007 |
| KR | 1020070070561 | 7/2007 |
| KR | 1020130082068 | 7/2013 |

OTHER PUBLICATIONS

Notice of Allowance dated Dec. 14, 2015, in U.S. Appl. No. 14/468,772.

* cited by examiner

DISPLAY DEVICE AND METHOD OF FABRICATING THE SAME

CROSS REFERENCE TO RELATED APPLICATION

This application is a Divisional of U.S. patent application Ser. No. 14/468,772, filed on Aug. 26, 2014, which claims priority from and the benefit of Korean Patent Application No. 10-2014-0030984, filed on Mar. 17, 2014, which are both hereby incorporated by reference for all purposes as if fully set forth herein.

BACKGROUND

Field

Exemplary embodiments of the present disclosure relate to a display device and a method of fabricating the same.

Description of the Background

Display devices are devices for visually displaying data. Examples of display devices include, but are not limited to, a liquid crystal display (LCD), an electrophoretic display, an organic light-emitting display, an inorganic electroluminescent (EL) display, a field emission display, a surface-conduction electron-emitter display, a plasma display, and a cathode ray tube (CRT) display.

A display device may include a plurality of pixels, and each of the pixels may include a thin-film transistor (TFT) for driving a corresponding pixel and a storage capacitor for storing charges according to a data signal.

The storage capacitor may include two electrodes and a dielectric element disposed between the two electrodes, and a low-specific resistance material may be used to fabricate the storage capacitor for better electrical performance of the storage capacitor. However, in some cases, low-specific resistance materials may generate hillocks while being thermally treated, and may cause an electrical short circuit.

The above information disclosed in this Background section is provided to enhance understanding of the background of the disclosed subject matter and therefore may contain information that does not form any part of the prior art nor what the prior art may suggest to a person of ordinary skill in the art

SUMMARY

Exemplary embodiments of the present disclosure provide a display device including a storage capacitor capable of preventing an electrical short circuit that may be caused by hillocks.

Exemplary embodiments of the present disclosure also provide a method of fabricating a storage capacitor capable of preventing an electrical short circuit that may be caused by hillocks.

Additional features of the present disclosure will be set forth in the description which follows, and in part will be apparent from the description, or may be learned by practice of the disclosed subject matter.

Exemplary embodiments of the present disclosure disclose a display device including a substrate, at least one transistor, and a storage capacitor. The at least one transistor is disposed on the substrate and includes an active layer, at least one gate insulating layer, a gate electrode, a source electrode, and a drain electrode. The storage capacitor includes a first storage electrode and a second storage electrode overlapping the first storage electrode. The at least one gate insulating layer is interposed between the first storage electrode and the second storage electrode. A top surface of the first storage electrode includes hillocks.

Exemplary embodiments of the present disclosure disclose a method of fabricating a display device. The method includes forming a first storage electrode, forming hillocks on the first storage electrode by performing a heat treatment process, forming an insulating layer on the first storage electrode, and forming a second storage electrode patterning the first storage electrode. The insulating layer is formed between the first storage electrode and the second storage electrode.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate exemplary embodiments of the disclosed subject matter, and together with the description serve to explain the principles of the disclosed subject matter.

DETAILED DESCRIPTION OF THE ILLUSTRATED EMBODIMENTS

Figure 1:
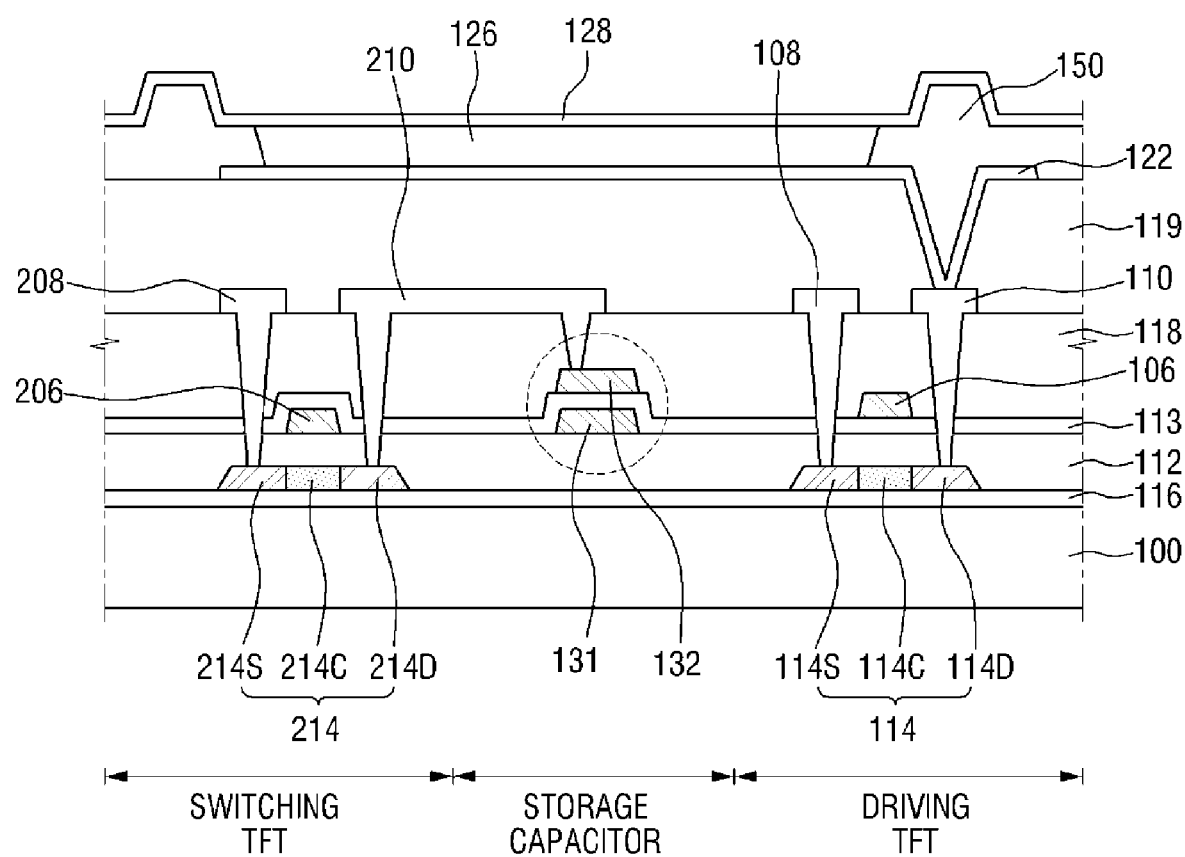
FIG. 1 is a schematic cross-sectional view illustrating a display device according to exemplary embodiments of the disclosed subject matter.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Hereinafter, exemplary embodiments of the disclosed subject matter will be described in detail with reference to the accompanying drawings.

Figure 2:
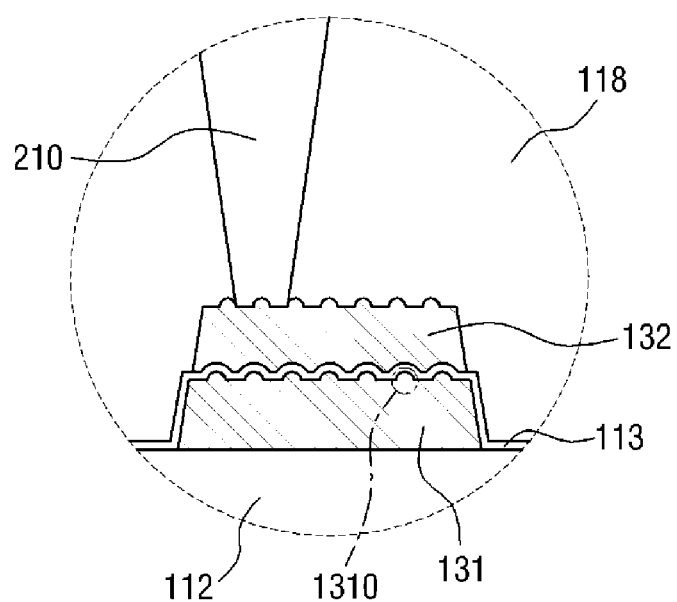
FIG. 2 is an enlarged view illustrating a storage capacitor of the display device of FIG. 1 according to exemplary embodiments of the disclosed subject matter.

FIG. 1 is a schematic cross-sectional view illustrating a display device according to exemplary embodiments of the present disclosure. FIG. 2 is an enlarged view illustrating a storage capacitor of the display device of FIG. 1 according to exemplary embodiments of the present disclosure.

Referring to FIGS. 1 and 2, a display device may include a switching thin-film transistor ("TFT") connected to a gate line (not illustrated) through which a scan signal is applied and a data line (not illustrated) through which a data signal is applied. A driving TFT is connected to the switching TFT and a first electrode 122 of an organic electroluminescent ("EL") device. A storage capacitor is connected to a drain electrode 210 of the switching TFT. The switching TFT, the driving TFT and the storage capacitor may be collectively referred to as a driving unit.

The driving unit may include a substrate 100 and a buffer layer 116 formed on the substrate 100. The switching TFT, the driving TFT, and the storage capacitor may be formed on the buffer layer 116.

The substrate 100 may be formed in the shape of a plate, and may support structures formed thereon. The substrate 100 may be formed of an insulating material. For example, in some cases, the substrate 100 may be formed of glass, polyethyeleneterepthalate ("PET"), polycarbonate ("PC"), polyethersulfone ("PES"), polyimide ("PI"), or polymethylmethacrylate ("PMMA"). In some cases, the substrate 100 may be formed of a flexible material. In general, the substrate 100 may have any suitable shape and may be made of various suitable materials.

In some cases, the buffer layer 116 may not be formed on the substrate 100. When disposed on the substrate 100, the buffer layer 116 may prevent impurities from infiltrating into the substrate 100, and may planarize the top surface of the substrate 100. The buffer layer 116 may be formed of various materials. For example, one of a silicon nitride layer, a silicon oxide layer, and a silicon oxynitride layer may be used to form the buffer layer 116.

The switching TFT may be formed on an active layer 214, which is disposed on the buffer layer 116. A gate electrode 206 may overlap a channel region 214C of the active layer 214 with a first gate insulating layer 112 interposed therebetween. A source electrode 208 and a drain electrode 210 may be insulated from the gate electrode 206 by a second gate insulating layer 113 and an interlayer dielectric layer 118. The source electrode 208 and the drain electrode 210 may be connected to a source region 214S and a drain region 214D, respectively, of the active layer 214 via a source contact hole and a drain contact hole, respectively, which are formed through the first gate insulating layer 112, the second gate insulating layer 113, and the interlayer dielectric layer 118. The source electrode 208 and the drain electrode 210 may have a single-layer structure or a triple-layer structure. In some cases, the source electrode 208 and/or the drain electrode 210 may be formed of a single layer of Molybdenum (Mo), Titanium (Ti), Copper (Cu), Aluminum (Al), Chromium (Cr), Aluminum Neodymium (Nd), a Mo alloy, a Cu alloy, a Nd alloy, or an Al alloy. In some cases, the source electrode 208 and/or the drain electrode 210 may be formed of a triple layer of Mo/Al/Mo, Ti/Al/Ti, Cu/Mo/Ti, or Mo/Ti/Al(Nd).

The driving TFT may adjust the amount of light emitted by the organic EL device by controlling a current applied to the organic EL device via a power line (not illustrated) in accordance with a data signal applied to the gate electrode 106 of the driving TFT.

The driving TFT may include an active layer 114, which is disposed on the buffer layer 116. A channel region 114C of the active layer 114 may overlap with the second gate insulating layer 113 and the first gate insulating layer 112 interposed therebetween. A source electrode 108 and a drain electrode 110 may be insulated from the gate electrode 106 by the interlayer dielectric layer 118. The source electrode 108 and the drain electrode 110 may be connected to a source region 114S and a drain region 114D, respectively, of the active layer 114 via a source contact hole and a drain contact hole, respectively, which are formed through the first gate insulating layer 112, the second gate insulating layer 113, and the interlayer dielectric layer 118. The source electrode 108 and the drain electrode 110 may have a single-layer structure or a triple-layer structure. In some cases, the source electrode 108 and the drain electrode 110 may be formed of a single layer of Mo, Ti, Cu, AlNd, Al, Cr, a Mo alloy, a Cu alloy, a Nd alloy, or an Al alloy. In some cases, the source electrode 108 and the drain electrode 110 may be formed of a triple layer of Mo/Al/Mo, Ti/Al/Ti, Cu/Mo/Ti, or Mo/Ti/Al(Nd).

The first gate insulating layer 112 and the second gate insulating layer 113 may insulate the active layers 114 and 214 from the gate electrodes 106 and 206, respectively. The first gate insulating layer 112 and the second gate insulating layer 113 may be formed of silicon nitride, silicon oxide, or any other suitable material.

The storage capacitor may include a first storage electrode 131 formed on the first gate insulating layer 112. The storage capacitor may further include a second storage electrode 132 overlapping the first storage electrode 131 with the second gate insulating layer 113 interposed therebetween.

The storage capacitor allows a uniform current to continue to flow through the driving TFT even when the switching TFT is turned off. For instance, when the switching TFT is turned off, the driving TFT may continue to supply a uniform current to the organic EL device with the use of the voltage stored in the storage capacitor and may thus allow the organic EL device to continue to emit light.

The first storage electrode 131 and the second storage electrode 132 are formed on the first gate insulating layer 112, and may overlap each other with the second gate insulating layer 112 interposed therebetween.

The second storage electrode 132 may be connected to the drain electrode 210 of the switching TFT via a storage contact hole, which is formed through the interlayer dielectric layer 118.

The first storage electrode 131 and the second storage electrode 132 may have a specific resistance of 7.4 Ωm or less. To attain this resistance, at least one of the first storage electrode 131 and the second storage electrode 132 may include Al or an Al alloy.

However, since Al has low thermal resistance, hillocks may be generated on the first storage electrode 131 and/or the second storage electrode 132 during a high-temperature chemical vapor deposition ("CVD") process or a heat treatment process used to form the first storage electrode 131 and/or the second storage electrode 132. In some cases, a top surface of the first storage electrode 131 may include hillocks 1310, and the second gate insulating layer 113 may be formed between the first storage electrode 131 and the second storage electrode 132, conforming to the shape of the top surface of the first gate insulating layer 131 with the hillocks 1310. The second gate insulating layer 113 may be formed after the formation of the hillocks 1310 on the first storage electrode 131, thereby preventing an electric short circuit that may be caused by the hillocks 1310.

A capacitor may satisfy Equation 1 below. The capacitance of a capacitor may be proportional to a relative dielectric constant ($\epsilon_r$) and the area (A) of electrodes, and may be inversely proportional to the thickness (t) of a dielectric layer between the electrodes. That is, the smaller the thickness (t) of a dielectric layer between two electrodes, the higher the capacitance of the capacitor becomes, and the greater the thickness (t) of the dielectric layer, the lower the capacitance of the capacitor becomes.

$$\frac{\epsilon_r \cdot \epsilon_0 \cdot A}{t} = C \quad \text{(Equation 1)}$$

$\epsilon_r$ denotes a relative dielectric constant; $\epsilon_0$ denotes the dielectric constant of vacuum; A denotes the overlap area of the first storage electrode 131 and the second storage electrode 132; and t denotes the thickness of a dielectric layer (e.g., second gate insulating layer 113) between the first storage electrode 131 and the second storage electrode 132.

Since the area of the storage capacitor may be restricted in the driving unit, the thickness of the second gate insulating layer 113 may need to be reduced to increase the capacitance of the storage capacitor.

The interlayer dielectric layer 118 may be formed on the substrate 100, the buffer layer 116, the active layers 114 and 214, the first gate insulating layer 112, the second gate insulating layer 113, the gate electrodes 106 and 206, the first storage electrode 131, and the second storage electrode 132. The interlayer dielectric layer 118 may cover the gate electrodes 106 and 206, and may insulate the gate electrodes 106 and 206 from the source electrodes 108 and 208, respectively, and from the drain electrodes 110 and 210, respectively. The interlayer dielectric layer 118 may be formed of silicon nitride, silicon oxide, or any other suitable material.

The gate electrode 206 of the switching TFT may be formed at the same level (e.g., height) as the first storage electrode 131, and the gate electrode 106 of the driving TFT may be formed at the same level (e.g., height) as the second storage electrode 132. In some cases (not shown), the gate electrode 206 of the switching TFT may be formed at the same level as the second storage electrode 132, and the gate electrode 106 of the driving TFT may be formed at the same level as the first storage electrode 131.

A planarization layer 119 may be formed on the switching TFT, the driving TFT, and the storage capacitor of the driving unit. To improve the luminous efficiency of an organic layer 126, which is disposed on the planarization layer 119, the planarization layer 119 may be formed to have a flat top surface with no stepped portions. The planarization layer 119 may be formed of an insulating material. For example, the planarization layer 119 may be formed of at least one of a polyacrylate resin, an epoxy resin, a phenolic resin, a polyamide resin, a polyimide resin, an unsaturated polyester resin, a polyphenylenether resin, a poly phenylenesulfide resin and benzocyclobutene ("BCB"). A contact hole may be formed in the planarization layer 119. The contact hole may expose the drain electrode 110 of the driving TFT. The first electrode 122 and the drain electrode 110 of the driving TFT may be connected to each other via the contact hole.

The organic EL device may include the first electrode 122 connected to the drain electrode 110 of the driving TFT, a pixel-defining layer 150 defining a pixel region on the first electrode 122, the organic layer 126 formed on the first electrode 122 in the pixel region, and a second electrode 128 formed on the organic layer 126 and the pixel-defining layer 150.

In response to a voltage being applied between the first electrode 122 and the second electrode 128, holes are injected from the first electrode 122, and electrons are injected from the second electrode 128. As the electrons and holes combine in a light-emitting layer, excitons are formed, and light is emitted as the excitons return to a ground state.

The organic layer 126 may include a hole injection layer, a hole transport layer, an organic light-emitting layer, an electron transport layer, and an electron injection layer.

The hole injection layer may be disposed on the first electrode 122. The hole injection layer may facilitate injection of holes into the organic light-emitting layer in response to an electric field being applied between the first electrode 122 and the second electrode 128.

The hole transport layer may be disposed over the hole injection layer. Holes transmitted from the hole injection layer may be transferred to the organic light-emitted layer via the hole transport layer.

The electron transport layer may be disposed over the hole transport layer with the organic light-emitting layer interposed therebetween. Electrons transmitted from the electron injection layer may be transferred to the organic light-emitting layer via the electron transport layer.

The electron injection layer may be disposed over the electron transport layer. The electron transport layer may facilitate injection of electrons into the organic light-emitting layer in response to an electric field being applied between the first electrode 122 and the second electrode 128.

In some cases, at least one of the hole injection layer, the hole transport layer, the electron transport layer, and the electron injection layer may be optional, and the organic layer 126 may include only one of the hole injection layer, the hole transport layer, the electron transport layer, and the electron injection layer.

The organic light-emitting layer may be disposed between the hole transport layer and the electron transport layer. The organic light-emitting layer may emit light at a luminance corresponding to a current applied thereto in response to an electric field being generated between the first electrode 122 and the second electrode 128. The organic light-emitting layer may emit light in accordance with a variation in the energy level of excitons formed by combining holes and electrons. By adjusting such variation, different colors of light may be realized.

The organic EL device may be of a top emission type, a bottom emission type (in which case, light is emitted from the bottom of the substrate 100), or a dual emission type, depending on the materials of the first electrode 122 and the second electrode 128.

In the description that follows, it is assumed that the organic EL device is of a top emission type.

The first electrode 122 may be formed on the planarization layer 119, and may be connected to the driving TFT via the contact hole in the planarization layer 119. A current applied to the first electrode 122 may be controlled by a signal applied by the driving TFT. The first electrode 122 may be formed of a reflective conductive material. For example, the first electrode 122 may be formed of Silver (Ag)/Indium Tin Oxide (ITO), ITO/Ag/ITO, Mo/ITO, Al/ITO, or Ti/ITO. When the first electrode 122 is formed of a reflective conductive material, the first electrode 122 may reflect light generated by the organic layer 126 upward.

The second electrode 128 may be disposed on the organic layer 126. The second electrode 128 may be formed of an optically transparent or semitransparent conductive material. For example, the second electrode 128 may be formed of ITO, indium zinc oxide (IZO), a compound of Mg and Ag, a compound of Calcium (Ca) and Ag, or a compound of Lithium (Li) and Al. Light generated by the organic layer 126 may be emitted outward through the second electrode 128. To improve the optical transmittance of the second electrode 128, the second electrode 128 may be formed to be thin. For example, in some cases, the second electrode 128 may be formed to a thickness of about 200 Å or less.

In FIG. 1, the display device may include two separate gate insulating layers, i.e., the first gate insulating layer 121 and the second gate insulating layer 122, but exemplary embodiments of the present disclosure are not limited thereto.

In FIG. 1, the driving unit may include two transistors, but exemplary embodiments of the present disclosure are not limited thereto. The driving unit may include only one transistor, or three or more transistors.

In FIG. 1, the driving unit including the driving TFT is connected to the organic EL device, but exemplary embodiments of the present disclosure are not limited thereto. For instance, the driving unit may be used in various other devices, such as a liquid crystal device.

Figure 3:
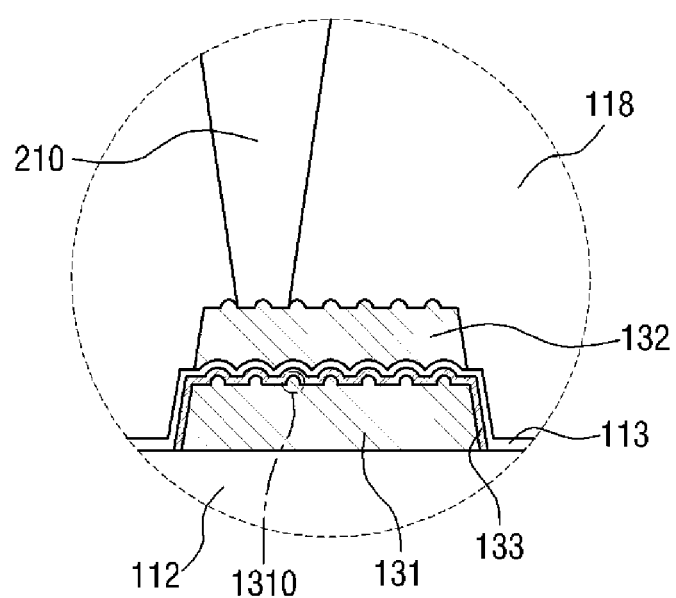
FIG. 3 is an enlarged view illustrating a storage capacitor of a display device according to exemplary embodiments of the disclosed subject matter.

FIG. 3 is a partial enlarged view illustrating a storage capacitor of a display device according to exemplary embodiments of present disclosure.

Referring to FIG. 3, a capping layer 133 may be formed on a first storage electrode 131. The capping layer 133 may prevent migration of Al. The capping layer 133 may be formed of at least one material selected from the group consisting of Titanium (Ti), Titanium Nitride (TiN), MoN, Mo, and a Mo alloy, but is not limited thereto. The capping layer 133 may also conform to the shape of the hillocks on the surface of the first storage electrode 131.

FIGS. 4 to 20 are schematic cross-sectional views illustrating a method of fabricating a display device, according to exemplary embodiments of the present disclosure.

Figure 4:
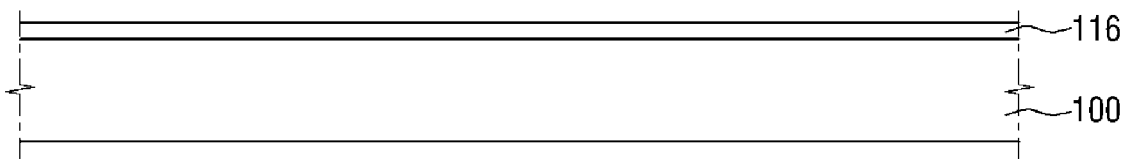
FIGS. 4, 5, 6, 7, 8, 9, 10, 11, 12, 13, 14, 15, 16, 17, 18, 19, and 20 are schematic cross-sectional views illustrating a method of fabricating a display device, according to exemplary embodiments of the disclosed subject matter.
Figure 5:
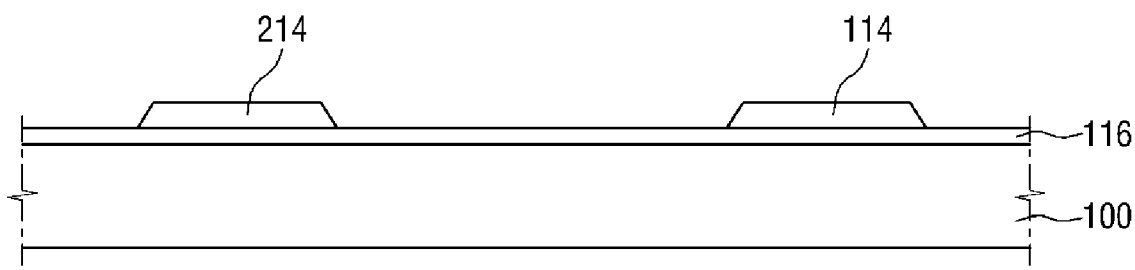
Figure 6:
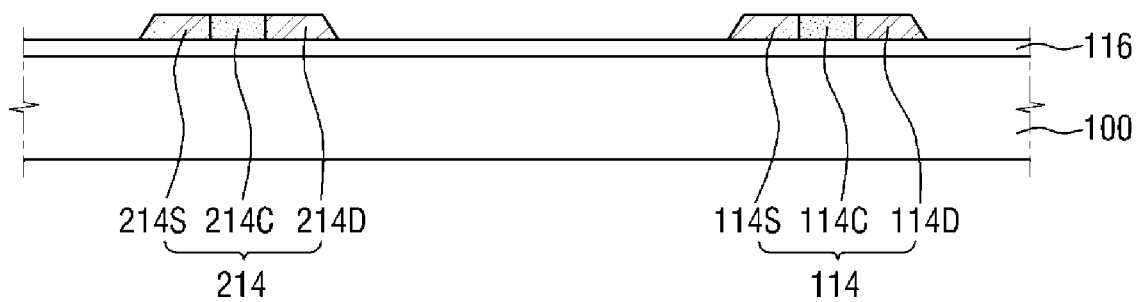
Figure 7:
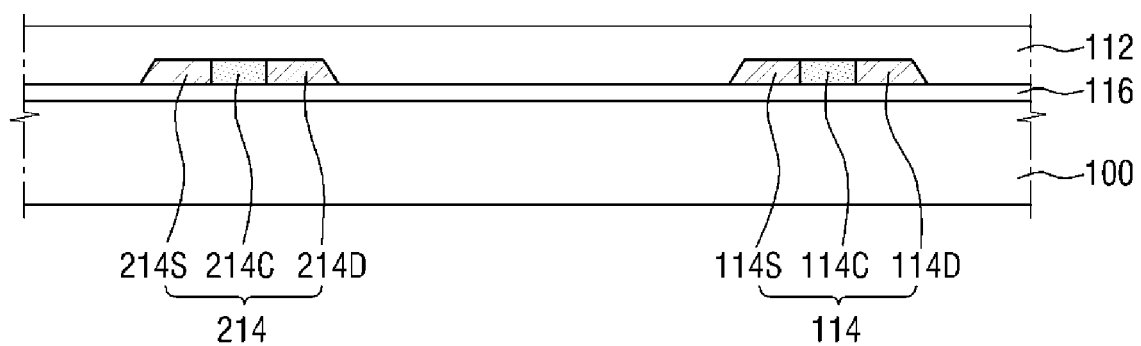
Figure 8:
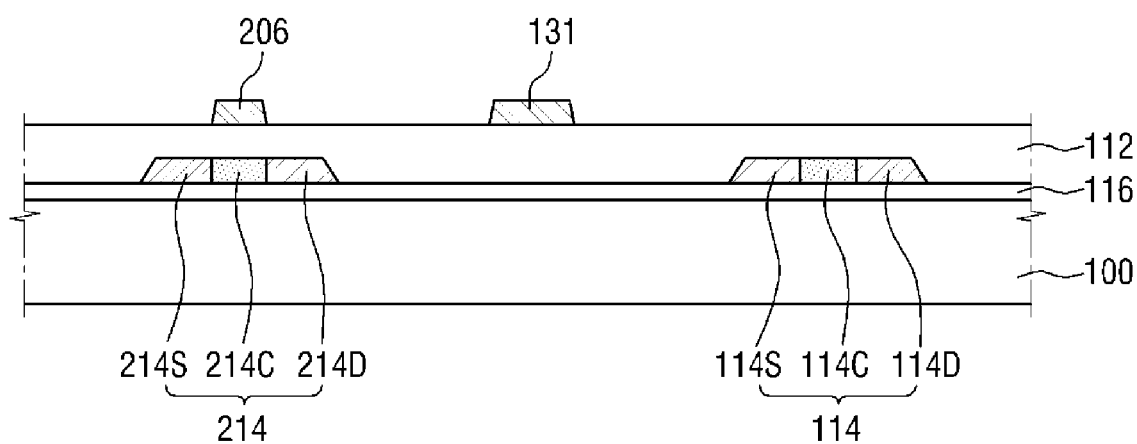
Figure 9:
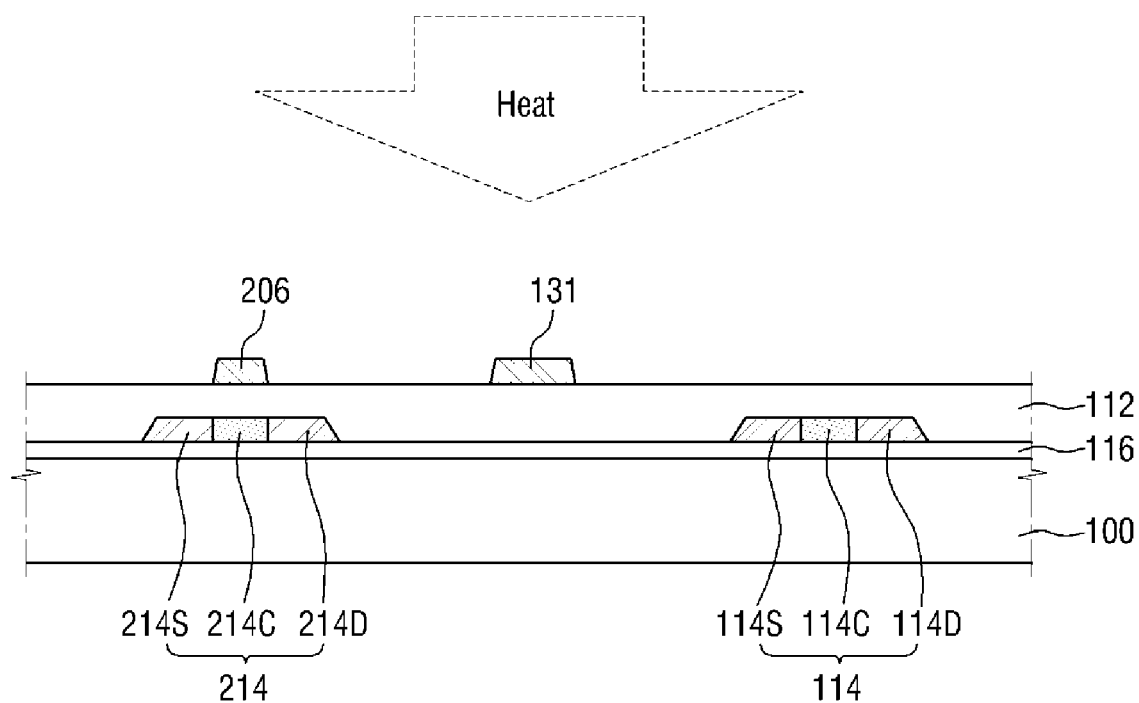

Referring to FIGS. 4 and 5, a buffer layer 116 is formed on a substrate 100, and an active layer 214 of a switching TFT and an active layer 114 of a driving TFT are formed on the buffer layer 116.

The active layers 114 and 214 may be formed of an oxide semiconductor, amorphous silicon, crystalline silicon, or polysilicon.

When the active layers 114 and 214 are formed of an oxide semiconductor, a single-component metal oxide, such as gallium oxide, indium oxide, tin oxide, or zinc oxide, or a multi-component metal oxide, such as gallium-indium-zinc oxide ("GIZO"), indium-gallium-tin oxide ("IGTO"), IZO, or zinc-aluminum oxide ("ZAO"), may be used.

The formation of the active layers 114 and 214 using, for example, polysilicon, will be described hereinafter.

The active layers 114 and 214 may be formed by depositing amorphous silicon on the buffer layer 116, crystallizing the amorphous silicon with the use of laser light so as to obtain polysilicon, and patterning the polysilicon through photolithography and etching using a mask.

Referring to FIGS. 6, 7, 8, and 9, source regions 114S and 214S and drain regions 114D and 214D may be formed by doping parts of the active layers 114 and 214 not overlapped by gate electrodes 106 and 206 with n+ or p+ impurities. The formation of the source regions 114S and 214S and the drain regions 114D and 214D may be performed as a separate process, after the formation of the gate electrodes 106 and 206, by using the gate electrodes 106 and 206 as masks. The source region 114S and the drain region 114D of the active layer 114 may face each other with a channel region 114C interposed therebetween, and the source region 214S and the drain region 214D of the active layer 214 may face each other with a channel region 214C interposed therebetween. The channel regions 114C and 214C may be overlapped by the gate electrodes 106 and 206, respectively.

A first gate insulating layer 112 is formed on the active layers 114 and 214. In some cases, the first gate insulating layer 112 may be formed by plasma-enhanced chemical vapor deposition ("PECVD").

A gate electrode 206 of the switching TFT and a first storage electrode 131 are formed on the first gate insulating layer 112. In some cases, the gate electrode 206 and the first storage electrode 131 may be formed by growing a film through sputtering, applying photoresist, and patterning the photoresist through photolithography and etching using a mask.

Even though not specifically illustrated in FIGS. 4 to 20, a capping layer may be additionally formed on the first storage electrode 131.

After the formation of the gate electrode 206 and the first storage electrode 131, a heat treatment process is performed at a higher temperature than the temperature at which subsequent processes are performed. As a result of the heat treatment, hillocks on the first storage electrode 131 may be formed.

The temperature at which to perform the heat treatment process may vary depending on the temperature at which subsequent processes may be performed. In some cases, the heat treatment process may be performed at a temperature of about 550° C. to about 650° C. for about one to five minutes. The duration of the heat treatment process may be determined based on the temperature and the material of first storage electrode 131. It should be understood that various suitable temperatures and heat treatment durations may be used.

Figure 10:
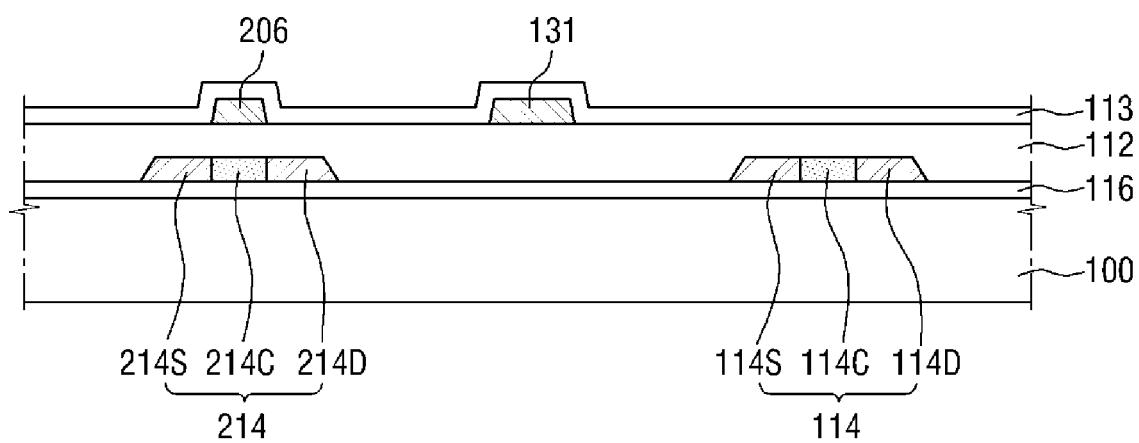

Referring to FIG. 10, a second gate insulating layer 113 is formed on the gate electrode 206 and the first storage electrode 131 with hillocks formed thereon. The second gate insulating layer 113 may be formed by the same method used to form the first gate insulating layer 112, and may be relatively thinner than the first gate insulating layer 112.

Figure 11:
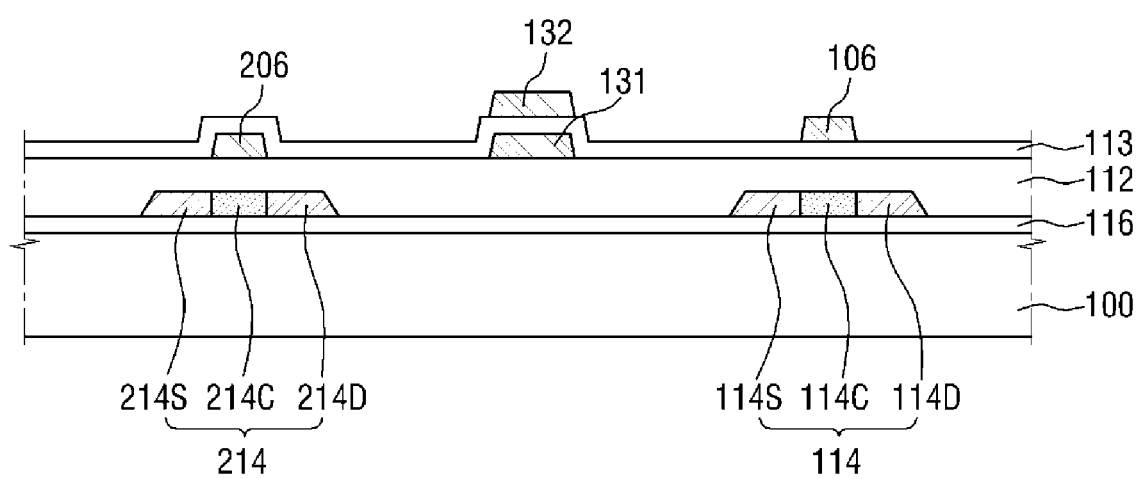

Referring to FIG. 11, a gate electrode 106 of the driving TFT and a second storage electrode 132 are formed on the second gate insulating layer 113. The gate electrode 106 and the second storage electrode 132 may be formed by the same method used to form the gate electrode 206 of the switching TFT and the first storage electrode 131.

Figure 12:
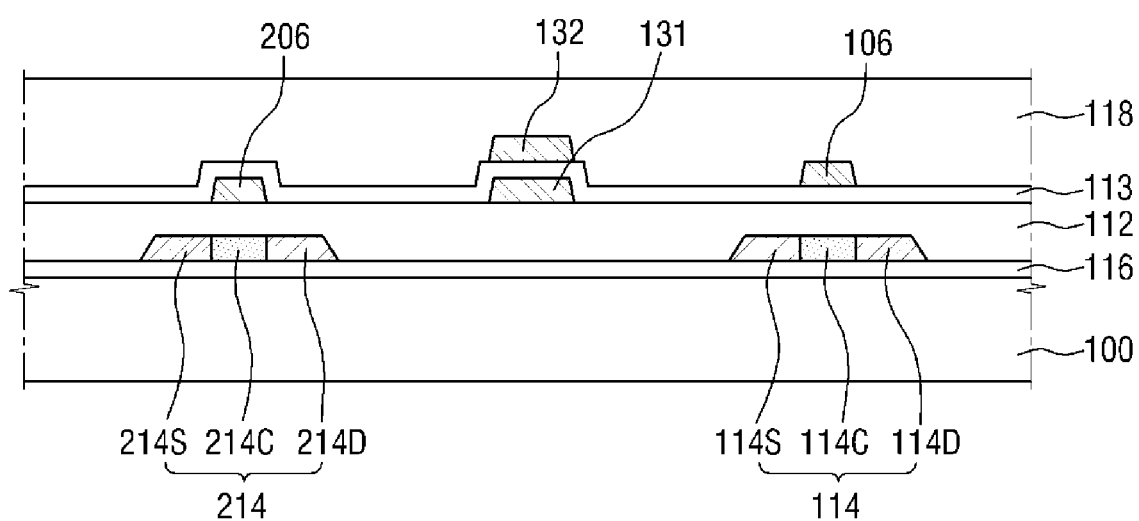

Referring to FIG. 12, an interlayer dielectric layer 118 is formed on the second gate insulating layer 113, the gate electrode 206, and the second storage electrode 132. The interlayer dielectric layer 118 may be formed of an inorganic insulating material, such as silicon oxide or silicon nitride, by a deposition method, such as PECVD or CVD.

Figure 13:
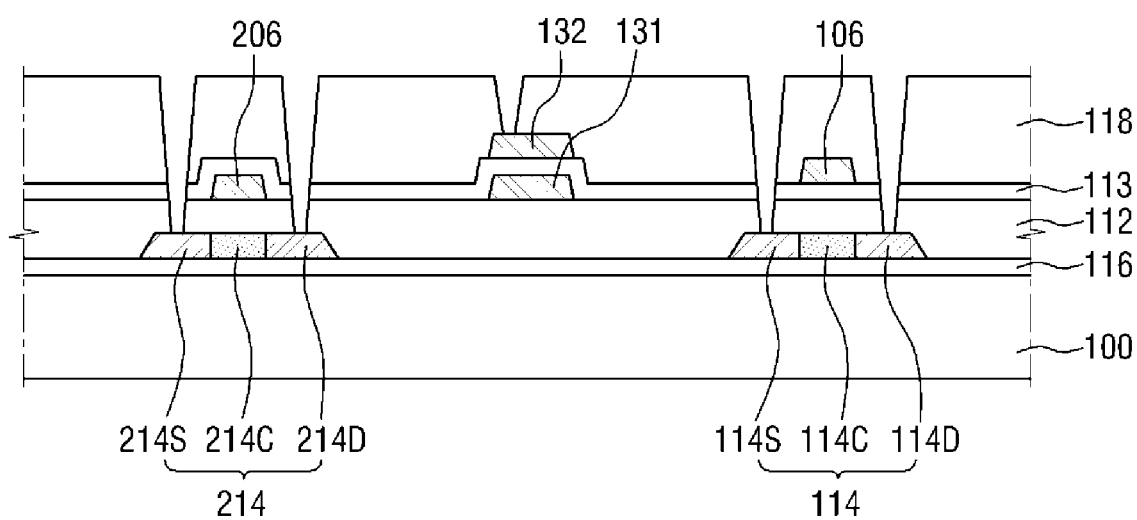

Referring to FIG. 13, source contact holes, drain contact holes, and a storage contact hole are formed by photolithography and etching using a mask. The source contact holes are formed through the first gate insulating layer 112, the second gate insulating layer 113, and the interlayer dielectric layer 118, and expose the source regions 114S and 214S of the active layers 114 and 214 of the driving and switching TFTs, respectively. The drain contact holes are formed through the first gate insulating layer 112, the second gate insulating layer 113, and the interlayer dielectric layer 118, and expose the drain regions 114D and 214D of the active layers 114 and 214 of the driving and switching TFTs, respectively. The storage contact hole is formed through the interlayer dielectric layer 118 and exposes the second storage electrode 132.

Figure 14:
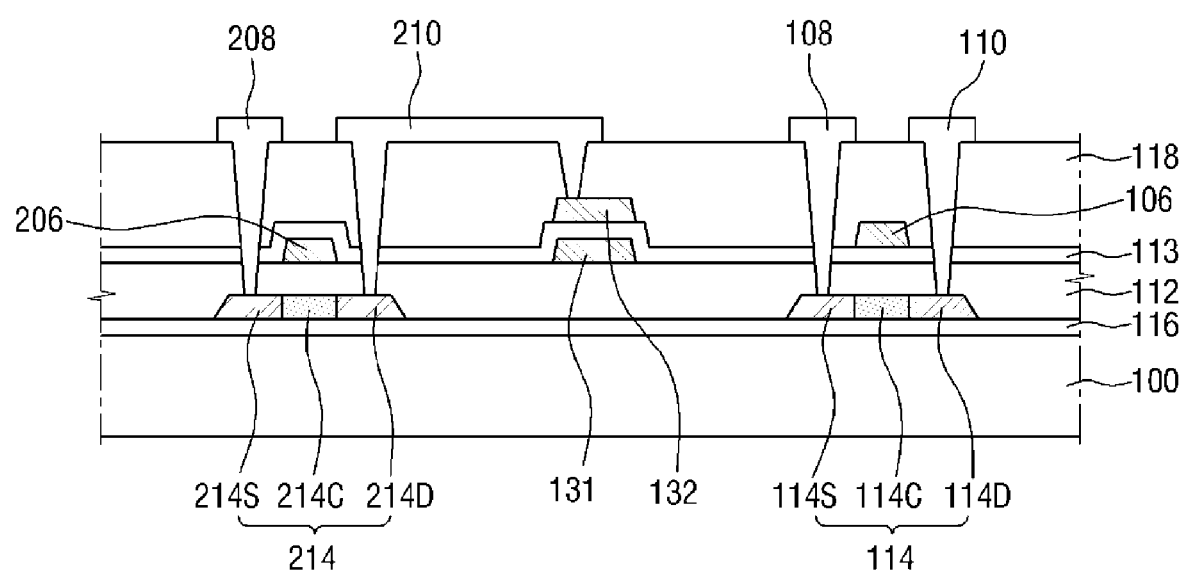

Referring to FIG. 14, source electrodes 108 and 208 of the switching and driving TFTs and drain electrodes 110 and 210 of the driving and switching TFTs, respectively, may be formed by forming a metal layer on the interlayer dielectric layer 118 and patterning the metal layer through photolithography and etching using a mask.

The source electrodes 108 and 208 are connected to the source regions 114S and 214S, respectively, via the source contact holes, respectively, and the drain electrodes 110 and 210 are connected to the drain regions 114D and 214D, respectively, via the source contact holes, respectively. The drain electrode 210 extends to the second storage electrode 132, and is connected to the second storage electrode 132 through the storage contact hole.

After formation of the switching and driving TFTs, an additional heat treatment process may be performed at a lower temperature than the temperature of the heat treatment process for forming hillocks. The additional heat treatment process may help stabilize the switching and driving TFTs. Since the additional heat treatment process is performed at a lower temperature than a temperature of the heat treatment process for forming hillocks, generation of additional hillocks can be prevented, and thus, the storage capacitor can be prevented from being short-circuited.

Figure 15:
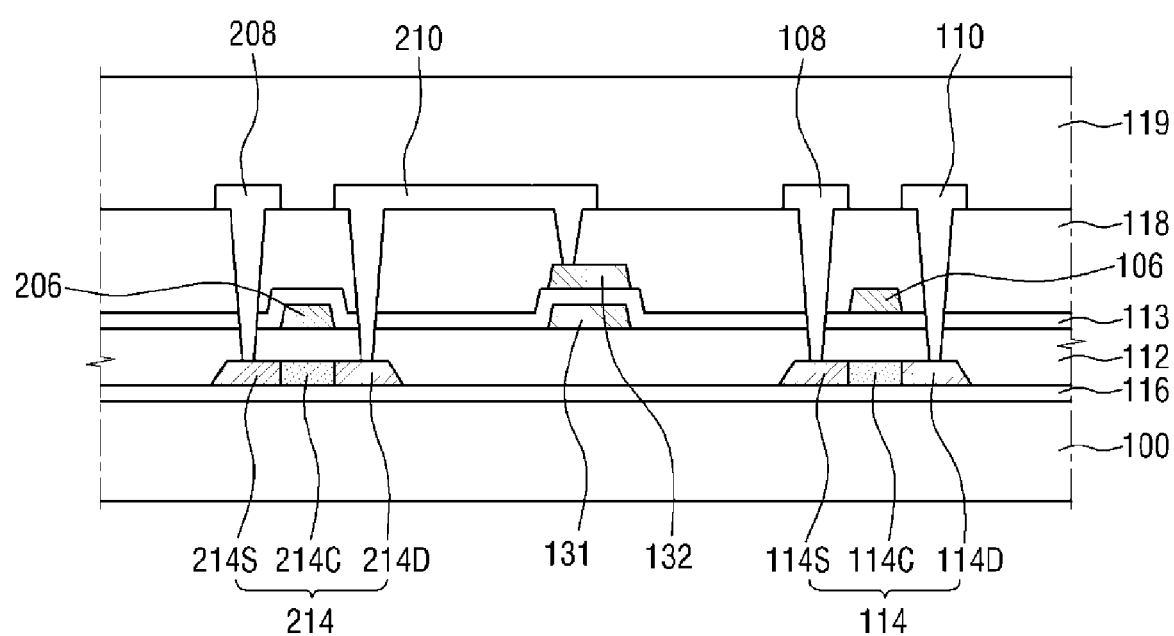
Figure 16:
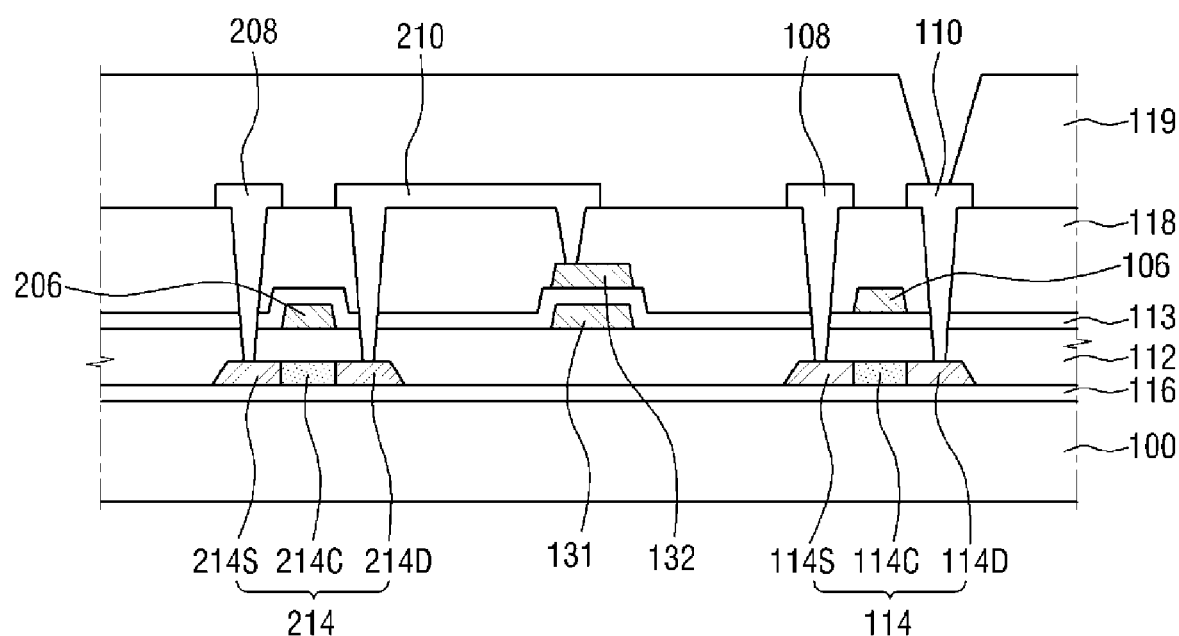

Referring to FIGS. 15 and 16, a planarization layer 119 may be formed on the interlayer dielectric layer 118 with the source electrodes 108 and 208 and the drain electrodes 110 and 210 of the driving and switching TFTs formed thereon. A pixel contact hole is formed through the planarization layer 119.

The planarization layer 119 may be formed by depositing an organic insulating material on the entire surface of the interlayer dielectric layer 118 with the source electrodes 108 and 208 and the drain electrodes 110 and 210 of the driving and switching TFTs formed thereon.

The pixel contact hole may be formed through the planarization layer 119 by photolithography and etching using a mask. The pixel contact hole exposes the drain electrode 110 of the driving TFT.

Figure 17:
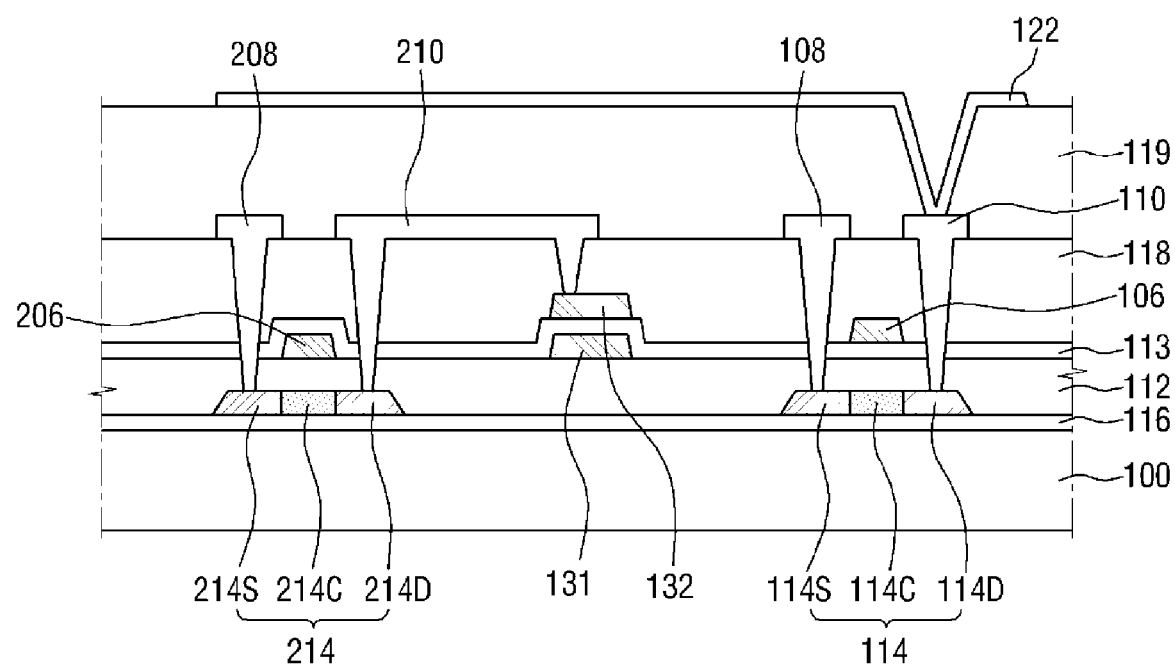

Referring to FIG. 17, a first electrode 122 may be formed by depositing an electrode layer on the planarization layer 119 and in the pixel contact hole, and patterning the electrode layer through photolithography and etching using a mask. The first electrode 122 is connected to the drain electrode 110 of the driving TFT via the pixel contact hole.

Figure 18:
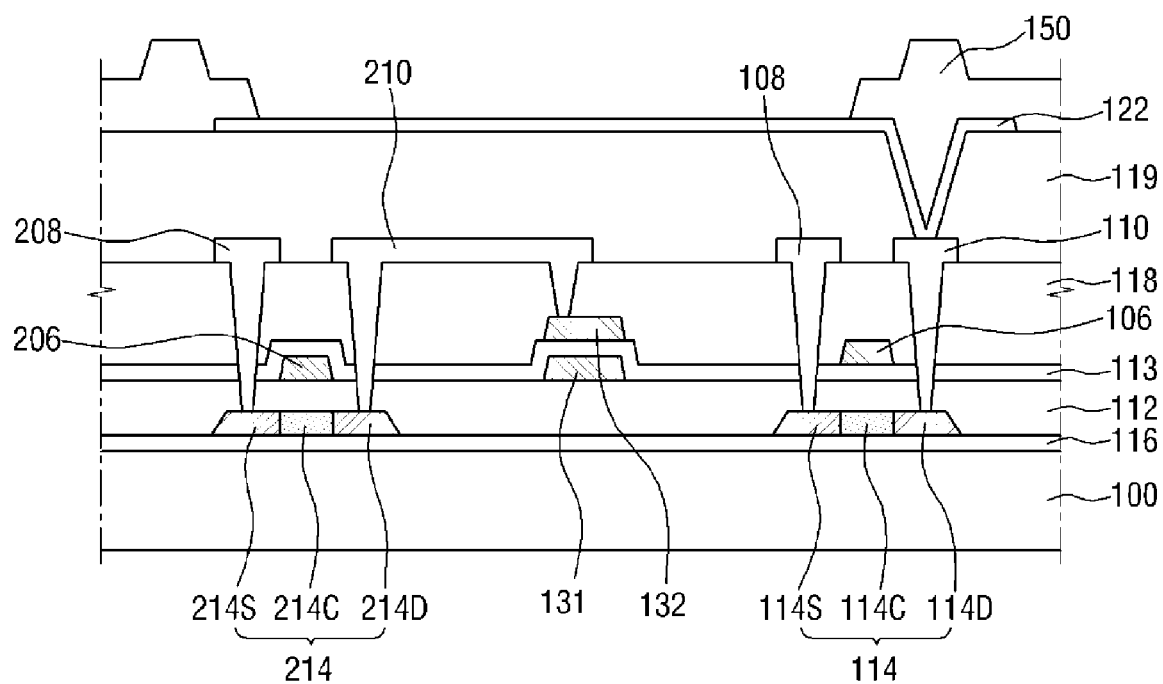

Referring to FIG. 18, a pixel-defining layer 150, which defines a pixel region, is formed on the planarization layer 119 and the first electrode 122. The pixel-defining layer 150 may be formed by applying an organic insulating material onto the planarization layer 119 and the first electrode 122, and patterning the organic insulating material through photolithography and etching using a mask.

Figure 19:
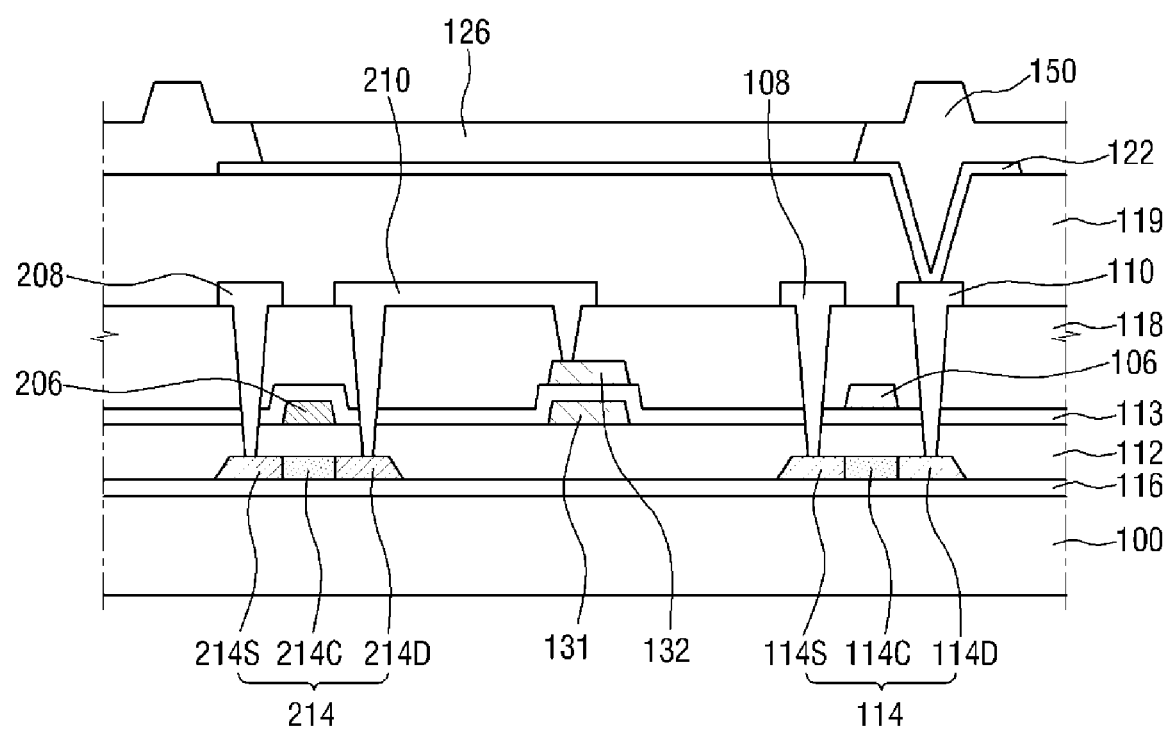

Referring to FIG. 19, an organic layer 126, including a hole injection layer, a hole transport layer, an organic light-emitting layer, an electron transport layer, and an electro injection layer, may be formed in the pixel region, i.e., part of the first electrode 122 exposed by the pixel-defining layer 150. One or more of the hole injection layer, the hole transport layer, the electron transport layer and the electron injection layer may be optionally formed.

Figure 20:
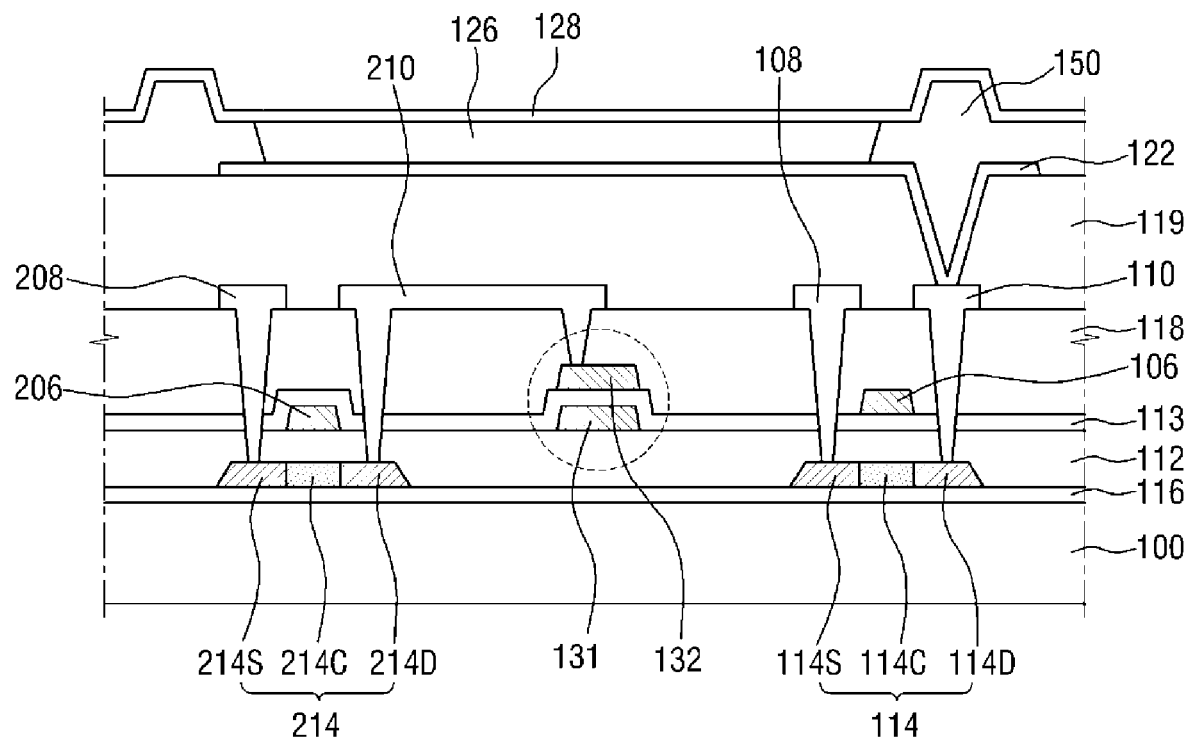

Referring to FIG. 20, a second electrode 128 is formed on the organic layer 126 and the pixel-defining layer 150, and the resulting structure may be referred to as a lower substrate.

An upper substrate (not illustrated) formed of an encapsulating glass may be additionally provided, and the lower substrate and the upper substrate may be combined together by a frit seal.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A method of fabricating a display device, comprising:
   forming a first storage electrode;
   forming hillocks on the first storage electrode by performing a heat treatment process;
   forming an insulating layer on the first storage electrode; and forming a second storage electrode overlapping the first storage electrode, wherein:

the insulating layer is formed between the first storage electrode and the second storage electrode;

the heat treatment process is performed at a temperature that is higher than temperatures at which the insulation layer and the second storage electrode are formed; and the first storage electrode is formed by the same process as a gate electrode of a switching transistor and the second storage electrode is formed by the same process as a gate electrode of a driving transistor.

2. The method of claim 1, wherein forming the hillocks comprises performing the heat treatment process at a temperature of about 550° C. to about 650° C.

3. The method of claim 1, wherein forming the hillocks comprises performing the heat treatment process for about one to five minutes.

4. The method of claim 1, wherein at least one of the first storage electrode and the second storage electrode comprises aluminum (Al) or an Al alloy.

5. The method of claim 1, further comprising forming a capping layer on the first storage electrode.

6. The method of claim 1, further comprising performing an additional heat treatment process at a temperature lower than a temperature of the heat treatment process for forming the hillocks.

\* \* \* \* \*